(12) United States Patent
Searby

(10) Patent No.: US 7,443,683 B2
(45) Date of Patent: Oct. 28, 2008

(54) COOLING APPARATUS FOR ELECTRONIC DEVICES

(75) Inventor: Tom J. Searby, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 359 days.

(21) Appl. No.: 10/993,194

(22) Filed: Nov. 19, 2004

(65) Prior Publication Data

US 2006/0109628 A1   May 25, 2006

(51) Int. Cl.
*H05K 7/20* (2006.01)
(52) U.S. Cl. .................. 361/710; 361/697; 361/709; 257/720
(58) Field of Classification Search ............. 361/697, 361/709, 710; 257/720
See application file for complete search history.

(56) References Cited

U.S. PATENT DOCUMENTS

| | | | |
|---|---|---|---|
| 3,774,078 A | 11/1973 | Martin | |
| 5,255,738 A | 10/1993 | Przilas | |
| 5,268,812 A | 12/1993 | Conte | |
| 5,353,863 A * | 10/1994 | Yu | 165/80.3 |
| 5,355,942 A | 10/1994 | Conte | |
| 5,448,107 A * | 9/1995 | Osada et al. | 257/706 |
| 5,597,034 A * | 1/1997 | Barker et al. | 165/80.3 |
| 5,844,310 A * | 12/1998 | Okikawa et al. | 257/712 |
| 6,397,926 B1 | 6/2002 | Sato et al. | |
| 6,407,922 B1 * | 6/2002 | Eckblad et al. | 361/704 |
| 6,651,734 B1 * | 11/2003 | Liu | 165/80.3 |
| 6,681,842 B2 | 1/2004 | Wagner | |
| 6,691,768 B2 * | 2/2004 | Hsieh et al. | 165/80.3 |
| 6,758,263 B2 * | 7/2004 | Krassowski et al. | 165/185 |
| 6,819,564 B2 * | 11/2004 | Chung et al. | 361/697 |
| 6,832,410 B2 * | 12/2004 | Hegde | 165/80.3 |
| 6,842,342 B1 * | 1/2005 | Lin | 361/710 |
| 6,874,565 B2 * | 4/2005 | Wagner | 165/80.3 |
| 6,958,915 B2 * | 10/2005 | Wang et al. | 361/709 |
| 6,967,845 B2 * | 11/2005 | Chiang et al. | 361/709 |
| 7,021,368 B2 * | 4/2006 | Lin et al. | 165/104.33 |
| 7,025,125 B2 * | 4/2006 | Sheng et al. | 165/104.33 |
| 7,048,039 B2 * | 5/2006 | Sarraf | 165/104.21 |
| 7,073,568 B2 * | 7/2006 | Chen et al. | 165/104.33 |
| 7,077,188 B2 * | 7/2006 | Chen | 165/80.3 |
| 2003/0102109 A1 | 6/2003 | Wagner | |
| 2003/0116312 A1 * | 6/2003 | Krassowski et al. | 165/185 |
| 2003/0131970 A1 * | 7/2003 | Carter et al. | 165/80.3 |
| 2003/0196780 A1 * | 10/2003 | Hegde | 165/80.3 |
| 2004/0011508 A1 | 1/2004 | Tan et al. | |
| 2004/0016532 A1 | 1/2004 | Wagner | |
| 2004/0016533 A1 | 1/2004 | Wagner | |
| 2004/0066624 A1 * | 4/2004 | Lee et al. | 361/697 |
| 2004/0159936 A1 * | 8/2004 | Ficorilli et al. | 257/720 |

(Continued)

FOREIGN PATENT DOCUMENTS

JP          56085842 A  *  7/1981

(Continued)

*Primary Examiner*—Anatoly Vortman

(57) ABSTRACT

In accordance with certain embodiments, a heat sink has a mounting base, a core structure extending outwardly from the mounting base, and a plurality of fins extending outwardly from the core structure in a direction parallel to the mounting base, wherein the core structure is at least partially elongated in the direction parallel to the mounting base toward outer extremities of the plurality of fins.

14 Claims, 8 Drawing Sheets

U.S. PATENT DOCUMENTS

| | | | |
|---|---|---|---|
| 2004/0261975 A1* | 12/2004 | Kozyra et al. | 165/80.3 |
| 2005/0073811 A1* | 4/2005 | Wang et al. | 361/688 |
| 2005/0088821 A1* | 4/2005 | Lee et al. | 361/697 |
| 2005/0117296 A1* | 6/2005 | Wu et al. | 361/697 |
| 2005/0195569 A1* | 9/2005 | Hsu | 361/697 |
| 2006/0092610 A1* | 5/2006 | Hegde | 361/697 |

FOREIGN PATENT DOCUMENTS

| | | | |
|---|---|---|---|
| JP | 60186046 A | * | 9/1985 |
| JP | 62123749 A | * | 6/1987 |
| JP | 02156557 A | * | 6/1990 |
| JP | 04039957 A | * | 2/1992 |
| JP | 04044254 A | * | 2/1992 |
| JP | 04284654 A | * | 10/1992 |

* cited by examiner

COOLING APPARATUS FOR ELECTRONIC DEVICES

BACKGROUND OF THE RELATED ART

Fans and heat sinks are often disposed in electronic devices to cool the various internal components. Heat sinks often have a plurality of fins or pins, which facilitate convective heat transfer away from the heat sink. Unfortunately, the primary conductive path to these fins or pins is generally long and unidirectional, i.e., either perpendicular or parallel to the heat source surface. In addition, a high contact resistance often exists between the primary conductive path and the fins or pins. The fins or pins are also generally limited in size due to the lack of structural support. Some heat sinks have larger fins or pins with supports or covers, which impedes the airflow through the heat sink.

A fan's position also impedes the airflow through the heat sink. In a typical heat sink and fan configuration, the fan is mounted above the heat sink. In this configuration, the airflow does not pass straight through the heat sink, but rather the airflow turns between a perpendicular orientation and a parallel orientation with respect to the base of the heat sink. As a result, this configuration impedes the airflow through the heat sink, thereby reducing the forced convection from the heat sink into the airflow. If the fan blows air downwardly onto the heat sink, then the heat sink also causes the heated air to turn onto the surrounding components.

SUMMARY

In accordance with certain embodiments, a heat sink has a mounting base, a core structure extending outwardly from the mounting base, and a plurality of fins extending outwardly from the core structure in a direction parallel to the mounting base, wherein the core structure is at least partially elongated in the direction parallel to the mounting base toward outer extremities of the plurality of fins.

BRIEF DESCRIPTION OF THE DRAWINGS

Advantages of one or more disclosed embodiments will become apparent upon reading the following detailed description and upon reference to the drawings in which.

DETAILED DESCRIPTION

Figure 1:
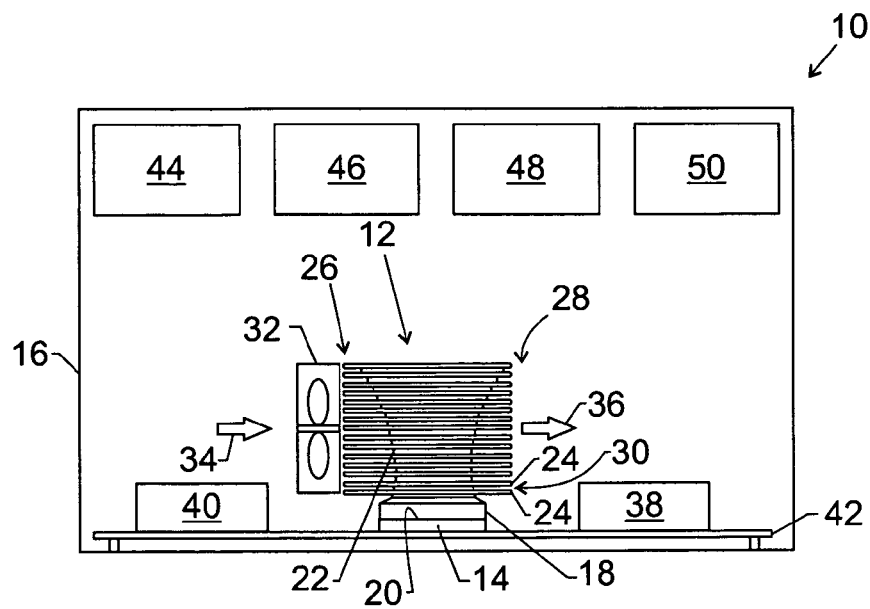
FIG. 1 is a diagrammatical view of a computer having a heat sink disposed over a component in accordance with embodiments of the present invention.

FIG. 1 is a diagrammatical view of an electronic device, such as a computer 10, having a heat sink 12 disposed over a component 14 within a housing 16 in accordance with embodiments of the present invention. For example, embodiments of the computer 10 include a desktop computer, a laptop or notebook computer, a tablet computer, a palm computer, a server, or another processor-based device. Moreover, embodiments of the component 14 include a variety of heat-generating devices and electronics, such as processors and other integrated circuit devices. As discussed in further detail below, the heat sink 12 includes a mounting base 18 that interfaces a top surface 20 of the component 14, a conductive core 22 that is outwardly flared from the mounting base 18, and multiple convective members 24 extending from the conductive core 22 in a direction substantially parallel to or across the mounting base 18. As defined in the present application, the word parallel includes exactly parallel, substantially parallel, or generally parallel. In other words, the parallel features in the present application are generally directed in the same direction as one another with some acceptable variance. These features of the heat sink 12 substantially increase the heat transfer away from the component 14, while reducing undesirable heat transfer to surrounding components.

For example, the conductive core 22 of FIG. 1 becomes increasingly elongated the further it extends from the mounting base 18, such that the conductive core 22 provides a shorter conductive path to outer extremities 26 and 28 of the convective members 24. In operation, the conductive core 22 spreads heat in multiple directions relative to the mounting base 18 and the component 14. In other words, the heat conductively flows through the conductive core 22 in both an outward direction toward the top of the heat sink 12 and, also, a lateral direction toward the outer extremities 26 and 28 of the convective members 24. These multiple directions of heat conduction through the conductive core 22 effectively reduce the primary heat conduction path to the convective members 24. Thus, the conductive core 22 spreads the heat more uniformly throughout the central and outer extremities 26 and 28 of the convective members 24. As a result, the convective members 24 can more effectively dissipate the heat into the surrounding air or forced airflow.

In the illustrated embodiment of FIG. 1, the conductive core 22 curvilinearly expands from the mounting base 18 to the top of the heat sink 12. In other embodiments, the conductive core 22 linearly expands from the mounting base 18 to the top of the heat sink 12. As discussed below, some embodiments of the conductive core 22 have a substantially constant width, which extends to the outer extremities 26 and 28 of the convective members 24. In these various embodiments, the elongated or flared nature of the conductive core 22 increases the heat spreading from the mounting base 18 throughout the central portions and outer extremities 26 and 28 of the convective members 24. The conductive core 22 also provides greater structural support for the convective members 24 at the outer extremities 26 and 28. As a result, the heat sink 12 has relatively larger convective members 24 and, thus, a greater surface area for convective heat transfer.

As further illustrated in FIG. 1, the convective members 24 are fins or panel-shaped structures, which are disposed one over the other in spaced relation above the mounting base 18. In this manner, the convective members 24 define boundaries of air passages or channels 30 that extend across or parallel to the mounting base 18 and the top surface 20 of the component 14. In other words, the channels 30 guide airflows provided by one or more fans, such as fan 32, in a substantially straight direction through the convective members 24 and around the conductive core 22, as indicated by arrows and 34 and 36. As a result, the airflow resistance is relatively low, because the air passes through the heat sink 12 without significant changes in flow direction. The airflow resistance is also reduced by the generally open nature of the channels 30 at the outer extremities 26 and 28 of the convective members 24. In other words, the heat sink 12 and surrounding components do not force the airflow to turn between perpendicular and parallel directions relative to the component 14. In addition, the illustrated core 22 is elongated in the direction of the airflows 34 and 36, such that the core 22 provides relatively lower impedance to the airflows 34 and 36 passing through the convective members 24. Altogether, the reduced airflow resistance of the illustrated heat sink 12 improves the forced convection away from the convective members 24, thereby improving the heat dissipation from the component 14.

In the illustrated system 10, the channels 30 also guide the air through the housing 16 in regions away from surrounding electronic components and devices, such as components 38 and 40 disposed on circuit board 42 and various other components 44, 46, 48, and 50. Thus, the heat transferred to the airflow 36 is preferably not directly blown onto the surrounding components, thereby substantially reducing undesirable heating of these surrounding components 38, 40, 42, 44, 46, 48, and 50. In certain embodiments, these components 38, 40, 42, 44, 46, 48, and 50 include an optical media drive (e.g., compact disc and digital video disk drives), a magnetic media drive (e.g., tape, floppy, and hard disk drives), random access memory, a video processing module, a video display, an audio processing module, speakers, one or more processors (e.g., central processing unit), a networking module, resistors, capacitors, core electronic components (CECs), controllers, voltage regulators, chips, and other heat-generating electronics.

Figure 2:
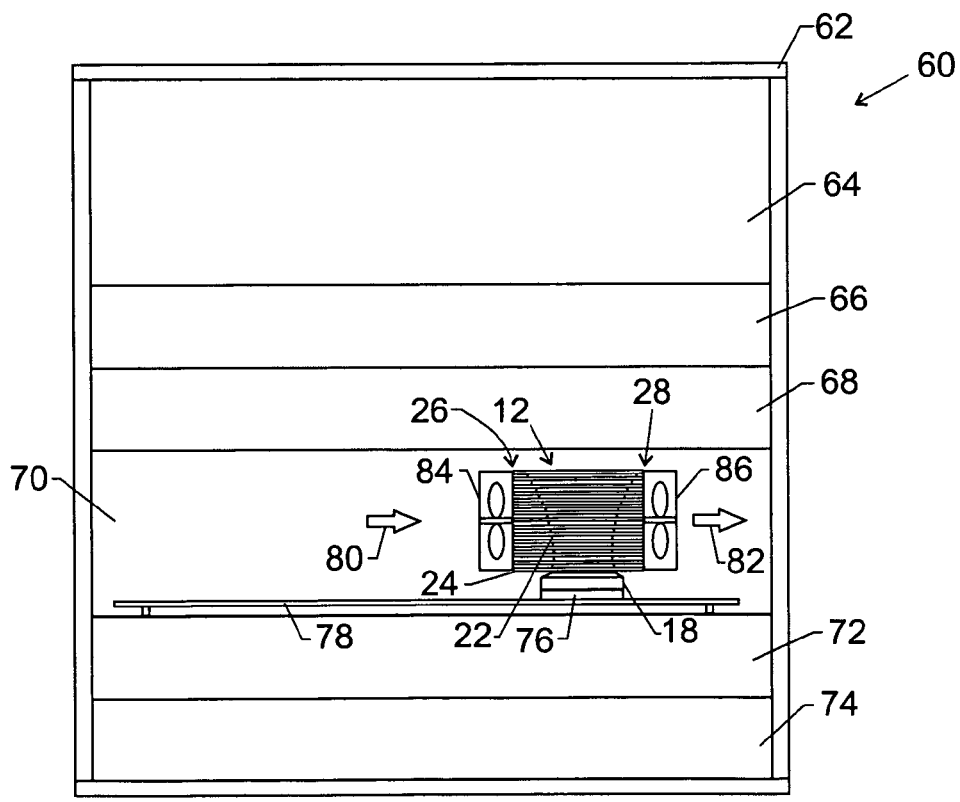
FIG. 2 is a diagrammatical view of a rack system having a heat sink disposed over a component within a rack mounted device in accordance with embodiments of the present invention.

FIG. 2 is a diagrammatical view of a rack system 60 having the heat sink 12 of FIG. 1 in accordance with embodiments of the present invention. As illustrated, the rack system 60 includes a rack structure 62, a number of rack mounted devices 64, 66, 68, 70, 72, and 74 disposed in the rack structure 62, and the heat sink 12 disposed over a component 76 on a circuit board 78. The illustrated rack system 60 is a rack mount computer system. Accordingly, the rack mounted devices 64, 66, 68, 70, 72, and 74 can include servers, displays, switches, and so forth. However, other embodiments of the rack system 60 and devices 64, 66, 68, 70, 72, and 74 include various other electronics and components. In certain embodiments, the component 76 may include a variety of heat-generating devices and electronics, such as a processor or other integrated circuit devices.

As discussed in detail above, the heat sink 12 improves both conductive and convective heat transfer away from the component 76. Specifically, the conductive core 22 has a width or cross-sectional geometry, which grows or expands the further the conductive core 22 extends from the mounting base 18. Thus, the conductive core 22 extends toward the outer extremities 26 and 28 of the convective members 24, such that the conductive core 22 increases the heat spreading to these outer extremities 26 and 28. As a result, the convective members 24 can more effectively dissipate the heat generated by the component 76. In addition, the convective members 24 are configured one over the other above the mounting base 18, such that the mounting base 18 and surrounding components do not restrict airflows 80 and 82 through the convective members 24. This configuration of the convective members 24 also enables the use of fans 84 and 86 at the opposite outer extremities 26 and 28, respectively. As illustrated, the fan 84 pushes the airflow 80 into the convective members 24, while the other fan 86 pulls the airflow 82 out from the convective members 24. These fans 84 and 86 can be provided for redundancy and/or for increased airflow through the heat sink 12.

Figure 3:
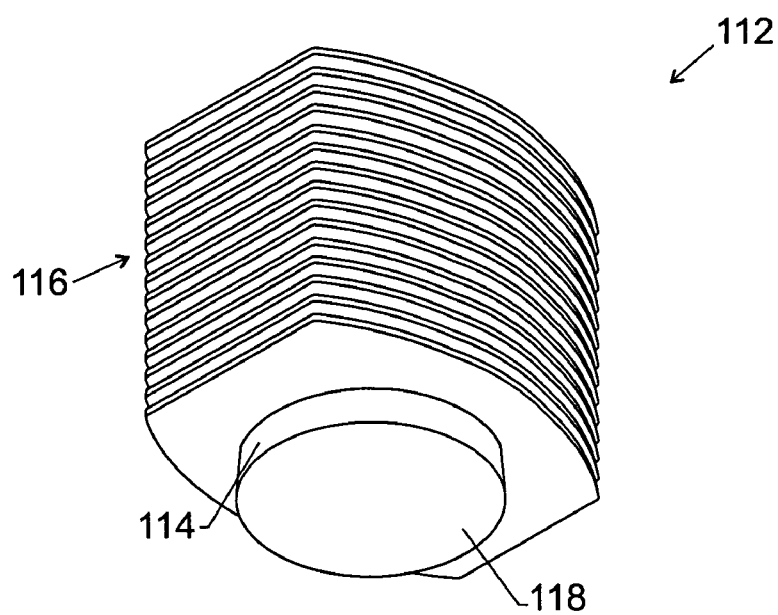
FIG. 3 is a perspective view of a heat sink in accordance with embodiments of the present invention.

FIG. 3 is a perspective view of a heat sink 112 in accordance with embodiments of the present invention. As illustrated, the heat sink 112 includes a mounting base 114 and multiple fins 116, which are positioned one over the other in spaced relation above the mounting base 114. Thus, the multiple fins 116 are substantially parallel with one another and with a component interface surface or underside 118 of the mounting base 114. In this manner, the multiple fins 116 channel air flow in a direction that is substantially parallel to the underside 118 of the mounting base 114.

Figure 4:
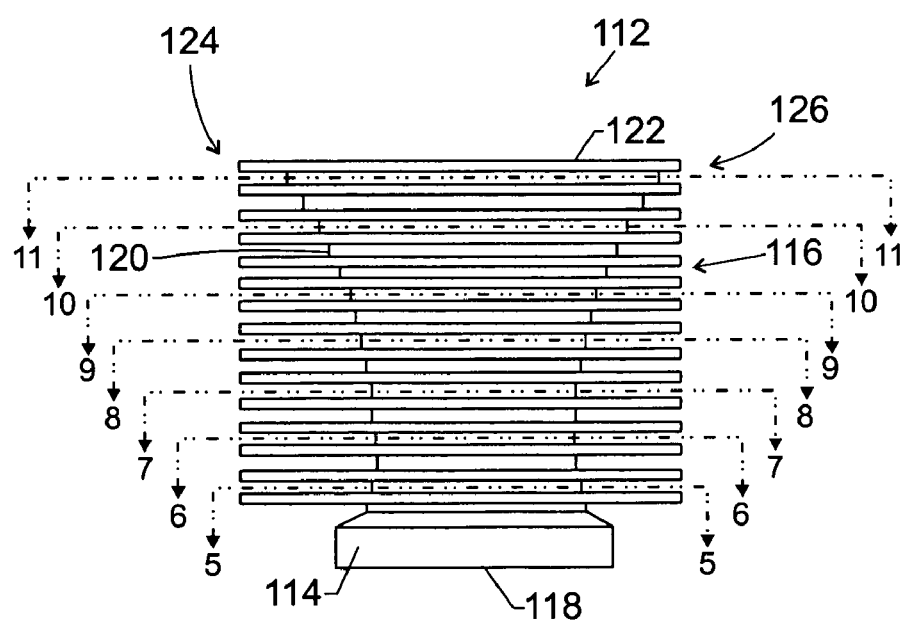
FIG. 4 is a side view of the heat sink of FIG. 3.
Figure 5:
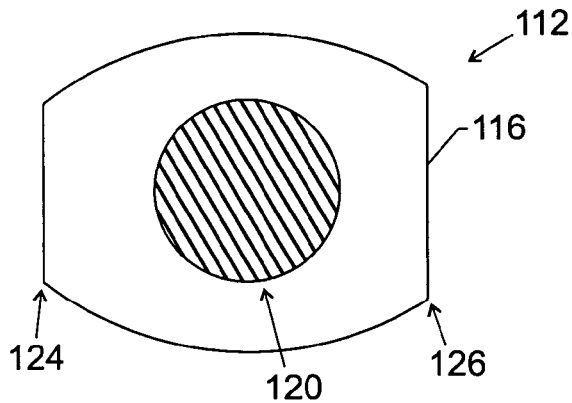
FIGS. 5-11 are cross-sectional top views of the heat sink of FIG. 4.
Figure 6:
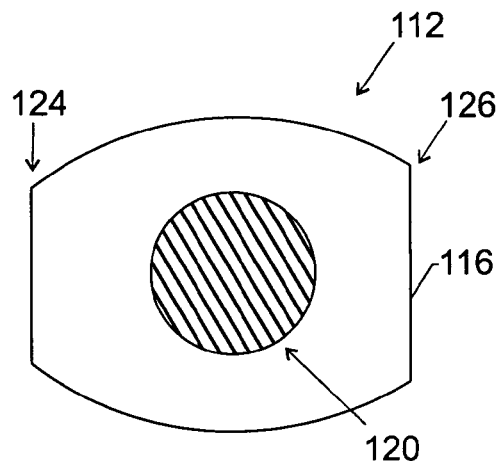
Figure 7:
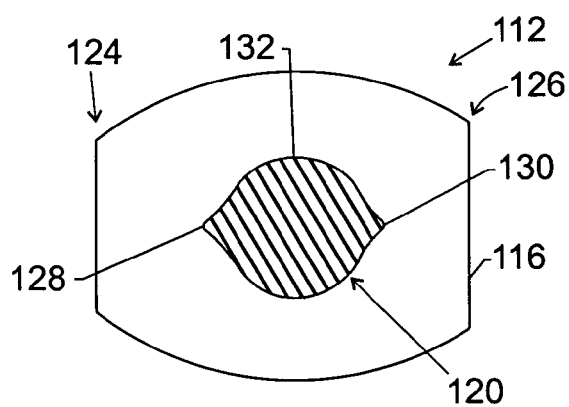
Figure 8:
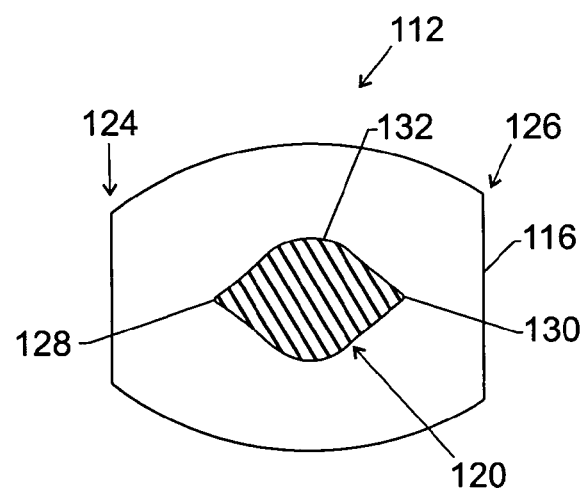
Figure 9:
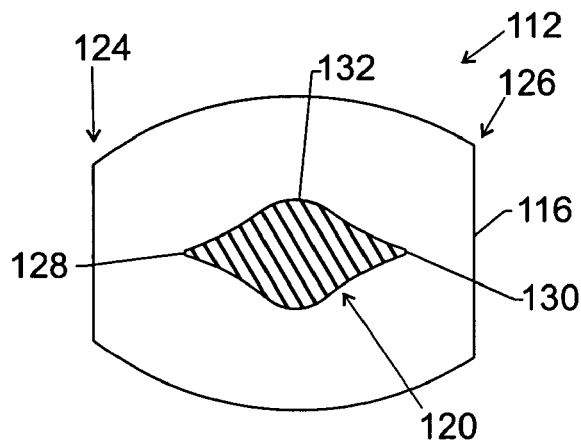
Figure 10:
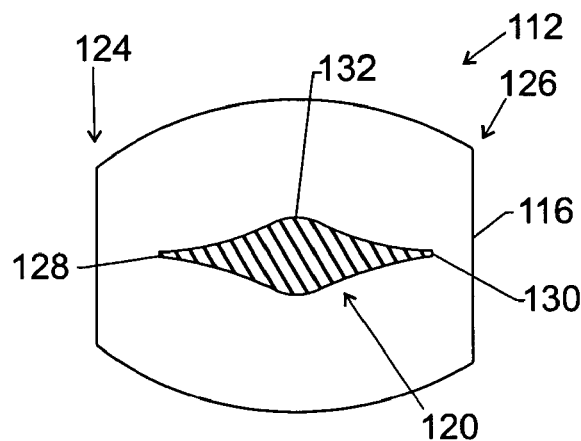
Figure 11:
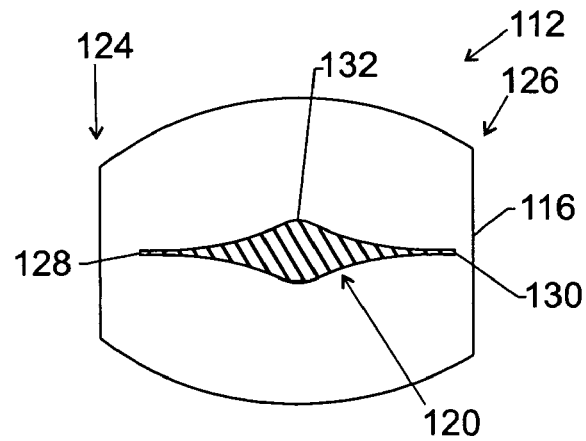

FIG. 4 is a side view of the heat sink of FIG. 3. As illustrated, the multiple fins 116 extends outwardly from a central conductive core 120, which is generally perpendicular to the mounting base 114. In other words, the multiple fins 116 are generally transverse or perpendicular to the central conductive core 120. As defined in the present application, the word perpendicular includes exactly perpendicular, substantially perpendicular, or generally perpendicular. The illustrated core 120 has a curved geometry, which progressively widens or becomes increasingly elongated from the mounting base 114 to a top side 122 of the heat sink 112. In this manner, the central conductive core 120 progressively approaches outer extremities 124 and 126 of the multiple fins 116 the further the core 120 extends from the mounting base 114. In operation, the lateral extension of the illustrated core 120 toward the outer extremities 124 and 126 provides a relatively shorter heat conduction path to these outer extremities, thereby providing a more uniform distribution of the heat among the multiple fins 116. As a result, the multiple fins 116 can convectively transfer the heat away the heat sink 112 more effectively.

FIGS. 5-11 are cross-sectional top views of the heat sink of FIG. 4 in accordance with embodiments of the present invention. As illustrated, the central conductive core 120 changes geometry from a circular cross-section in FIGS. 5 and 6 to a progressively elongated curved geometry in FIGS. 7-11. For example, the central conductive core 120 in FIGS. 7-11 has lateral extensions 128 and 130, which progressively approach the outer extremities 124 and 126 of the multiple fins 116. The illustrated core 120 also includes an intermediate portion 132 between the lateral extensions 128 and 130. As illustrated, this intermediate portion 132 decreases in size as the lateral extensions 128 and 130 become wider or more elongated. In this manner, the central conductive core 120 becomes increasingly aerodynamic or less resistive to airflow from the mounting base 114 to the top side 122 of the heat sink 112. Accordingly, the unique geometry of the conductive core 120 improves airflow through the heat sink 112 inline with the lateral extensions 128 and 130 from the outer extremity 124 to the outer extremity 126, and vice versa. The improved aerodynamics of the conductive core 120, in turn, improves the forced convective heat transfer away from the heat sink 112.

Figure 12:
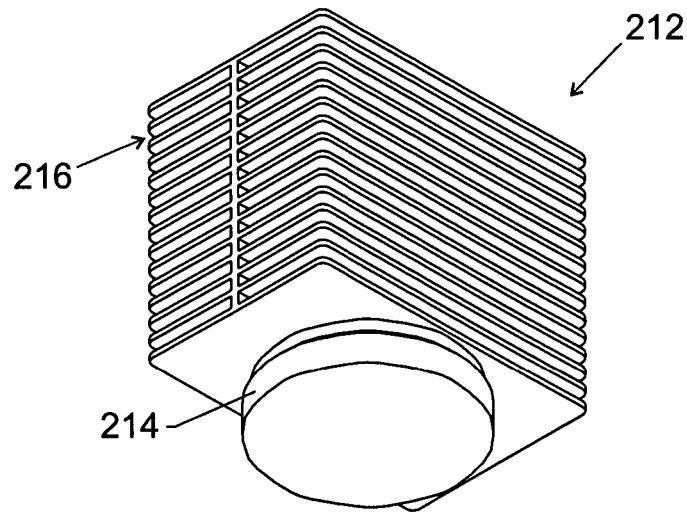
FIG. 12 is a perspective view of an alternative heat sink in accordance with embodiments of the present invention.
Figure 13:
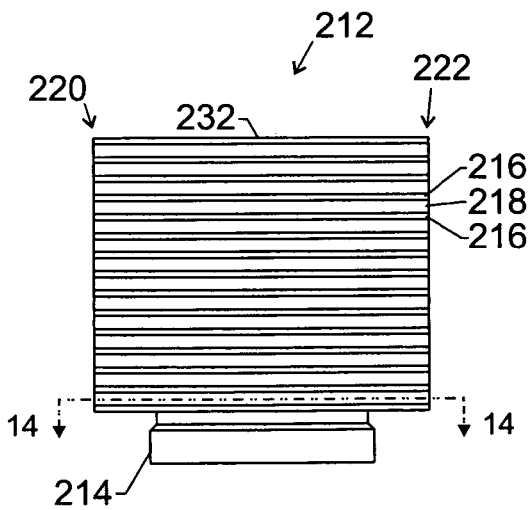
FIG. 13 is a side view of the heat sink of FIG. 12.
Figure 14:
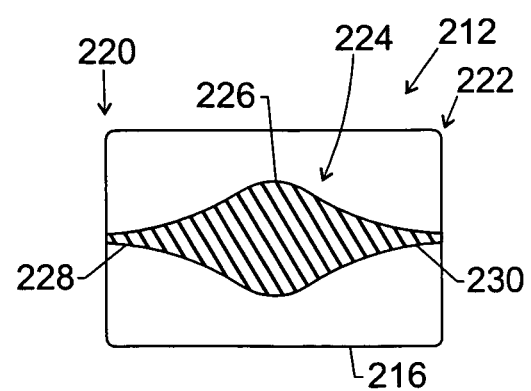
FIG. 14 is a cross-sectional top view of the heat sink of FIG. 13.

FIGS. 12-14 illustrate an alternative heat sink 212 in accordance with embodiments of the present invention. FIG. 12 is a perspective view illustrating the heat sink 212 having a mounting base 214 and a plurality of rectangular fins 216, which extend across the mounting base 214 one over the other in spaced relation. FIG. 13 is a side view of the heat sink of FIG. 12 illustrating air passageways or channels 218, which are formed by the spaced relation of the plurality of rectangular fins 216. As illustrated, these channels 218 extend between outer extremities 220 and 222 of the fins 216, such that air can flow through the fins 216 to force convection of heat away from the heat sink 212.

FIG. 14 is a cross-sectional top view of the heat sink of FIG. 13 illustrating an elongated conductive core 224, which has a central portion 226 and lateral extension portions 228 and 230. As illustrated, the lateral extension portions 228 and 230 extend to the outer extremities 220 and 222, respectively. In addition, the elongated conductive core 224 has a substantially uniform geometry from the mounting base 214 to a top side 232 of the heat sink 212. In operation, the lateral extension portions 228 and 230 shorten the primary conduction path to the outer extremities 220 and 222, thereby improving the distribution of heat to various portions of the fins 216. This improved heat distribution or spreading, in turn, improves the convection of heat away from the heat sink 212 from the fins 216. The relatively elongated geometry of the illustrated core 224 also improves airflow inline with the lateral extension portions 228 and 230. Moreover, a fan can be mounted at each of the outer extremities 220 and 222 of the fins 216, thereby increasing the airflow through the heat sink 212 and providing redundancies to ensure continuous cooling of the heat sink 212.

Figure 15:
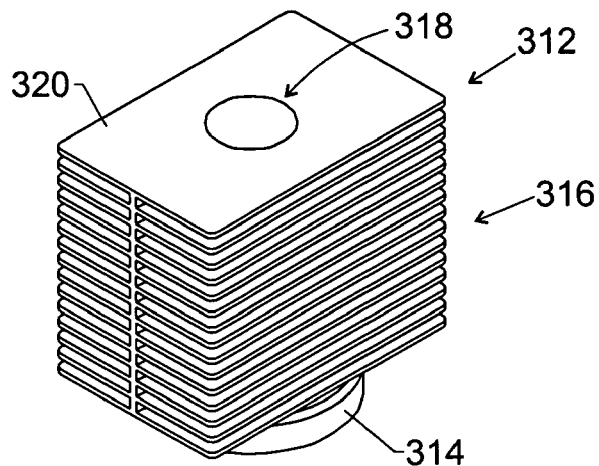
FIG. 15 is a perspective view of another alternative heat sink in accordance with embodiments of the present invention.
Figure 16:
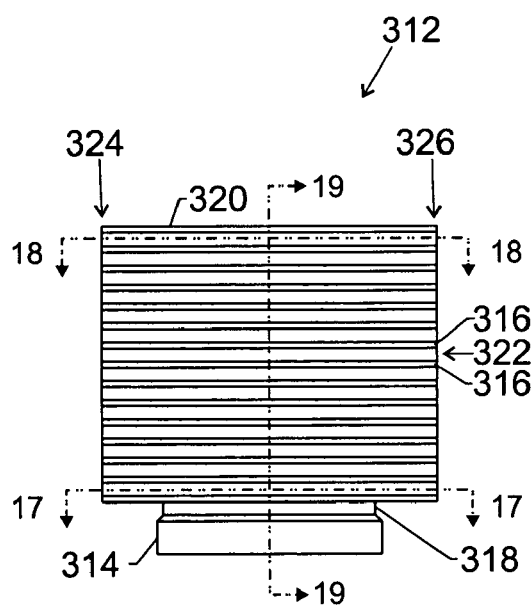
FIG. 16 is a side view of the heat sink of FIG. 15.

FIGS. 15-19 illustrate another alternative heat sink 312 in accordance with embodiments of the present invention. FIG. 15 is a perspective view illustrating the heat sink 312 having a mounting base 314, a plurality of fins 316 disposed one over the other in spaced relation above the mounting base 314, and a hollow conductive core 318 extending from the mounting base 314 to a top 320 of the plurality of fins 316. FIG. 16 is a side view illustrating the heat sink 312 of FIG. 15 having air passageways or channels 322 disposed between adjacent fins 316. The illustrated channels 322 extend between outer extremities or opposite sides 324 and 326 of the plurality of fins 316, such that air can flow from the side 324 to the side 326, and vice versa. In other words, the channels 322 are oriented in a generally parallel direction relative to the mounting base 314.

Figure 17:
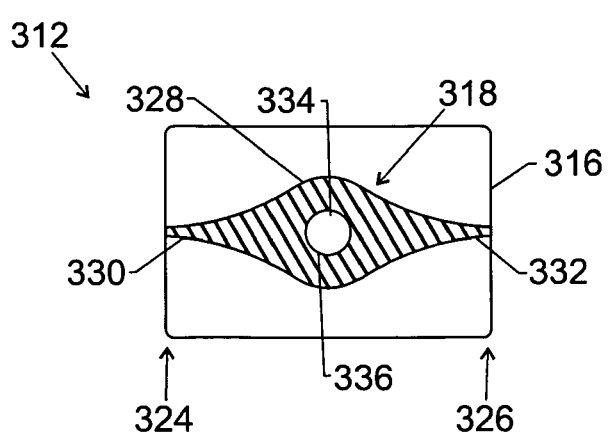
FIGS. 17 and 18 are cross-sectional top views of the heat sink of FIG. 16.
Figure 18:
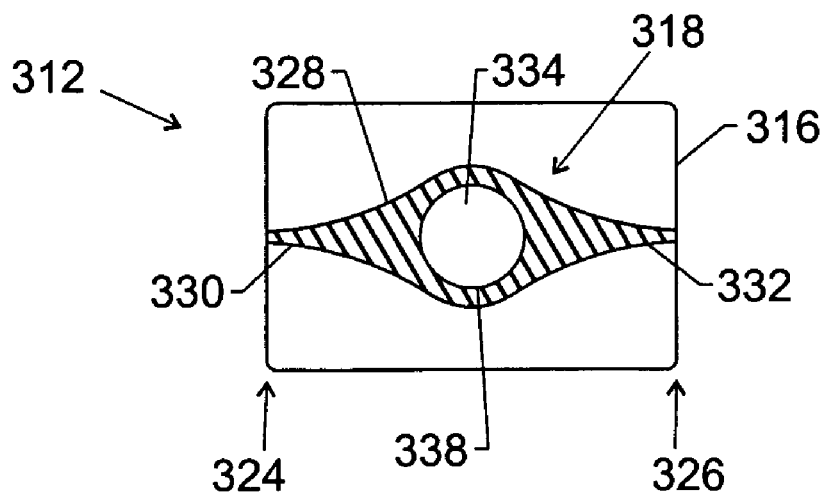

FIGS. 17 and 18 are cross-sectional top views of the heat sink 312 of FIG. 16 illustrating elongated hollow geometries of the hollow conductive core 318 in accordance with some embodiments of the present invention. As illustrated, the hollow conductive core 318 includes a central portion 328 and lateral extension portions 330 and 332, which extend from the central portion 328 outwardly to the outer extremities 324 and 326, respectively. In this exemplary embodiment, the hollow conductive core 318 has a constant exterior shape as the core 318 progresses further away from the mounting base 314. In other words, the size and shape of the central portion 328 and the lateral extension portions 330 and 332 are generally constant along the length of the hollow conductive core 318. These lateral extension portions 330 and 332 improve heat spreading to various portions of the fins 316, including the outer extremities 324 and 326. As a result, the fins 316 are able to convect heat away from the heat sink 312 more effectively. In addition, the elongated geometry of the hollow conductive core 318 improves airflow through the plurality of fins 316 from the outer extremity 324 to the outer extremity 326, and vice versa. In other words, the lateral extension portions 330 and 332 and the curved geometry of the central portion 328 increase the aerodynamics of the hollow conductive core 318. As a result, heat sink 312 more effectively dissipates heat from a component that interfaces the mounting base 314.

Figure 19:
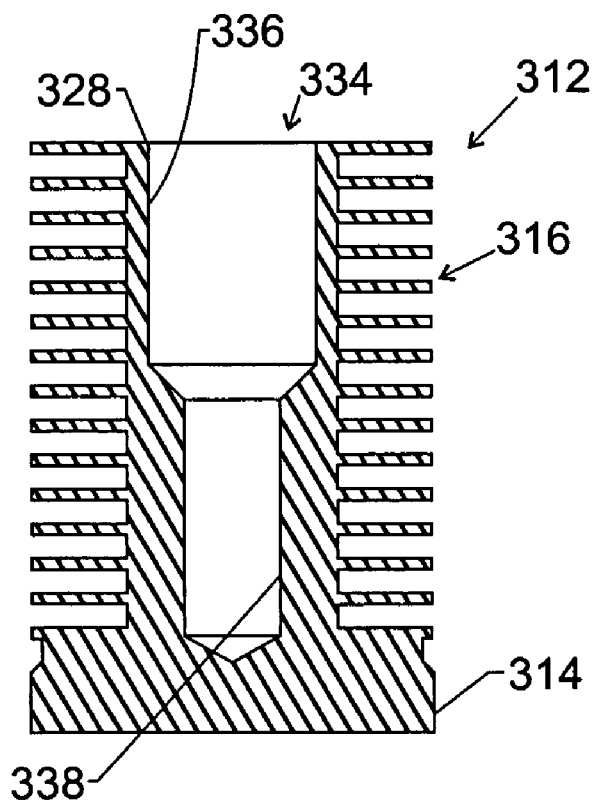
FIG. 19 is a cross-sectional side view of the heat sink of FIG. 15.

As further illustrated in FIGS. 17, 18, and 19, the central portion 328 of the hollow conductive core 318 has an interior chamber 334 in accordance with embodiments of the present invention. In the illustrated embodiment, the interior chamber 334 includes a first cylindrical passage 336 and a second cylindrical passage 338, which has a larger diameter than the first cylindrical passage 336. However, the passages 336 and 338 can have a variety of different or identical geometries in alternative embodiments of the heat sink 312. The interior chamber 334 provides a number of benefits. For example, the interior chamber 334 reduces the weight and material consumption of the heat sink 312. In some embodiments, the interior chamber 334 includes a heat pipe or circulating vapor chamber, which facilitates heat transfer from the mounting base 314 to the top 320 of the heat sink 312. Other heat transfer mechanisms also can be disposed within the interior chamber 334 to increase the heat spreading to various portions of the transfer fins 316. Thus, the interior chamber 334 functions to improve the characteristics of the heat sink 312.

Figure 20:
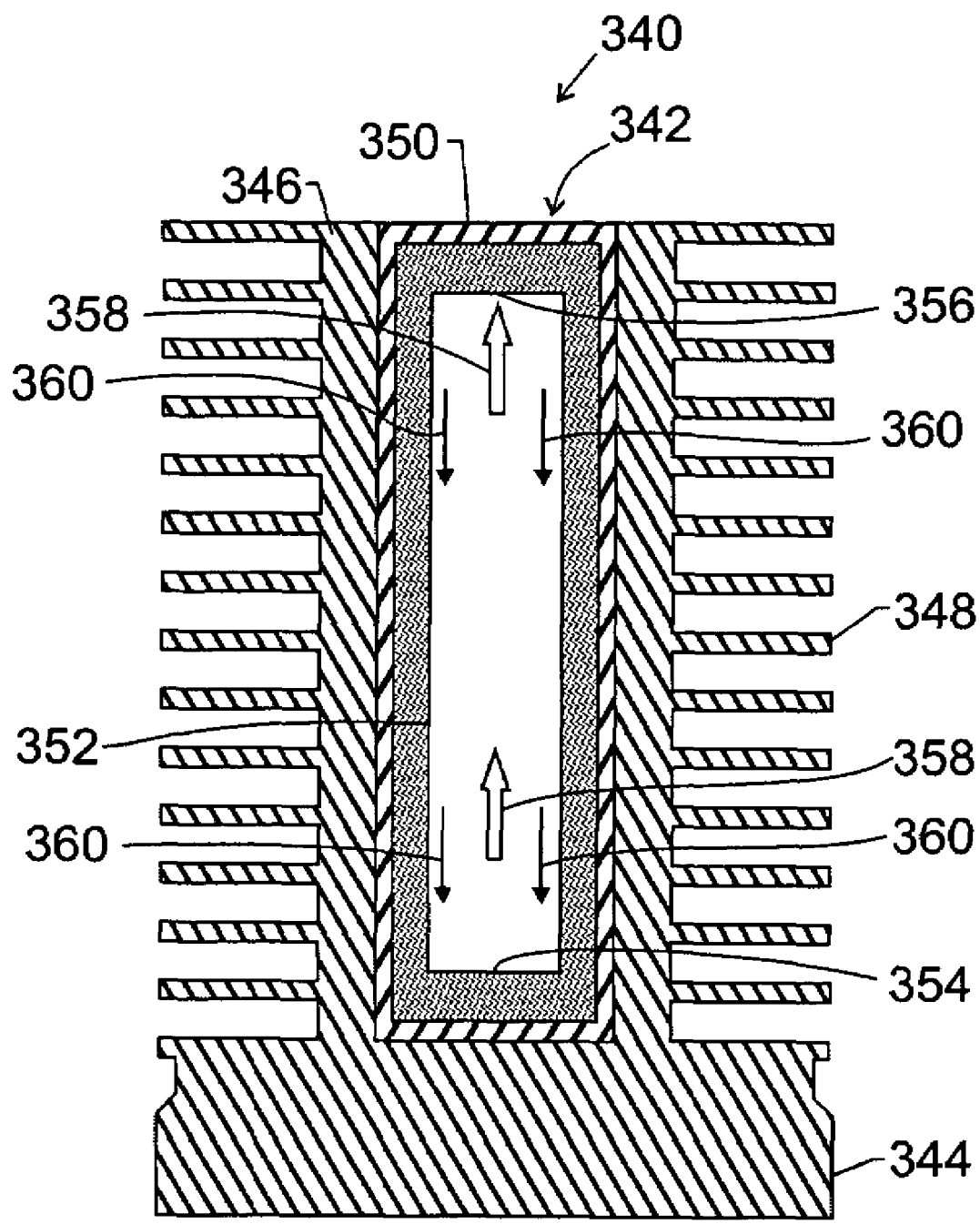
FIG. 20 is a cross-sectional side view of a heat sink having a heat pipe or vapor chamber in accordance with embodiments of the present invention.

Turning now to FIG. 20, this figure illustrates a heat sink 340 having a heat pipe or vapor chamber 342 in accordance with embodiments of the present invention. As illustrated, the heat sink 340 includes a mounting base 344, a thermally conductive core 346 that is substantially perpendicular to the mounting base 344, and a plurality of fins 348 that are substantially perpendicular to the core 346 and substantially parallel to the mounting base 344. This exemplary heat sink 340 also has portions of the thermally conductive core 346 that extend toward outer extremities of the fins 348. For example, the thermally conductive core 346 may have a geometry similar to the core 120 illustrated in FIGS. 4-11, or similar to the core 224 illustrated in FIG. 14, or similar to the core 318 illustrated in FIGS. 17-19. Inside the thermally conductive core 346, the heat pipe or vapor chamber 342 facilitates heat transfer away from the mounting base 344 along the length of the core 346.

In the illustrated embodiment of FIG. 20, the heat pipe or vapor chamber 342 includes a thermally conductive enclosure 350 having a porous material 352 lining the interior surface of the enclosure 350. For example, embodiments of the thermally conductive enclosure 350 include a closed copper pipe, and embodiments of the porous material 352 include a fabric material. The heat pipe or vapor chamber 342 also includes evaporator and condenser sections at opposite ends 354 and 356, respectively. The heat pipe or vapor chamber 342 also includes an amount of working fluid disposed in the porous material 352, such that the atmosphere inside the heat pipe or vapor chamber 342 has an equilibrium of liquid and vapor. In operation, as the mounting base 344 becomes heated, the fluid in the porous material 352 in the evaporator section 354 near the mounting base 344 evaporates and travels upward as indicated by arrows 358. Upon reaching the condenser section 356, the vapor condenses and collects in the porous material 352 due to the relatively lower temperature at the condenser section 356 versus the temperature at the evaporator section 354. The condensed vapor then travels through the porous material 352 from the condenser section 356 back toward the evaporator section 354, as indicated by arrows 360. Upon reaching the evaporator section 354, the cycle repeats as the condensed vapor becomes heated and evaporates. In this manner, the vapor carries heat from the evaporator section 354 to the condenser section 356, thereby facilitating heat transfer away from the mounting base 344 of the heat sink 340.

What is claimed is:

1. A system, comprising:
a chassis;
an electronic component disposed in the chassis; and
a heat sink disposed on the electronic component, wherein the heat sink comprises a plurality of convective heat transfer members extending outwardly from a conductive heat transfer member, wherein the conductive heat transfer member has lateral extension portions extending outwardly from a core in an air flow direction toward outer extremities of the plurality of convective heat transfer members, and the lateral extension portions have a geometry that varies along the air flow direction, wherein the heat sink comprises an air flow path in the air flow direction into the heat sink at a first side, completely through the heat sink, and out of the heat sink at a second side opposite from the first side.

2. The system of claim 1, wherein the lateral extension portions progressively spread toward the outer extremities as the conductive heat transfer member extends further from the electronic component.

3. The system of claim 1, wherein the chassis comprises a computer.

4. The system of claim 1, wherein the electronic component comprises a processor.

5. The system of claim 1, comprising a fan disposed adjacent the heat sink to move air through the plurality of convective heat transfer members in the air flow direction across the electronic component.

6. The system of claim 1, wherein the plurality of convective heat transfer members are aligned parallel with the air flow direction that is parallel to the electronic component.

7. A system, comprising:
a chassis;
an electronic component disposed in the chassis; and
a heat sink comprising a mounting base disposed on the electronic component, wherein the heat sink comprises:
a conductive heat transfer member that extends in a first direction perpendicular to the mounting base, wherein the conductive heat transfer member is elongated in a second direction parallel to the mounting base, and the conductive heat transfer member becomes increasingly elongated in the second direction the farther the conductive heat transfer member extends in the first direction from the mounting base; and
a plurality of convective heat transfer members extending outwardly from the conductive heat transfer member.

8. The system of claim 7, wherein the convective heat transfer members comprise fins positioned one over another in spaced relation above the mounting base.

9. The system of claim 7, wherein the convective heat transfer members do not force an airflow to turn between perpendicular and parallel directions relative to the mounting base.

10. A system, comprising:
a chassis;
an electronic component disposed in the chassis; and
a heat sink comprising a mounting base disposed on the electronic component, wherein the heat sink comprises:
a conductive heat transfer member that extends in a first direction transverse to the mounting base; and
a plurality of fins extending outwardly from the conductive heat transfer member in a second direction parallel to the mounting base, wherein the conductive heat transfer member comprises a lateral extension portion having a curved geometry extending in the second direction in contact with the fins, and the curved geometry becomes increasingly narrow in the second direction toward outer extremities of the plurality of fins.

11. The system of claim 10, wherein the fins are positioned one over another in spaced relation above the mounting base, and the fins do not force an airflow to turn between perpendicular and parallel directions relative to the mounting base.

12. The system of claim 10, wherein the curved geometry becomes increasingly elongated in the second direction the farther the curved geometry extends in the first direction from the mounting base.

13. A system, comprising:
a chassis;
an electronic component disposed in the chassis; and
a heat sink comprising a mounting base disposed on the electronic component, wherein the heat sink comprises:
a conductive heat transfer member that extends in a first direction transverse to the mounting base; and
a plurality of convective heat transfer members extending outwardly from the conductive heat transfer member in a second direction parallel to the mounting base, wherein the conductive heat transfer member comprises a curved geometry that varies in thickness in the second direction in contact with the plurality of convective heat transfer members, and the heat sink comprises an air flow path into a first side of the heat sink, completely through the heat sink, and out of an opposite second side of the heat sink.

14. The system of claim 13, wherein the convective heat transfer members comprise fins positioned one over another in spaced relation above the mounting base, and the curved geometry becomes increasingly elongated in the second direction the farther the curved geometry extends in the first direction from the mounting base.

* * * * *